United States Patent [19]

Kirkpatrick et al.

[11] 4,130,891

[45] Dec. 19, 1978

[54] METHODS OF GRAY SCALE RECORDING AND ARCHIVAL MEMORY TARGET PRODUCED THEREBY

[75] Inventors: Conilee G. Kirkpatrick, Schenectady; Harold G. Parks, Scotia, both of N.Y.

[73] Assignee: General Electric Company, Schenectady, N.Y.

[21] Appl. No.: 822,429

[22] Filed: Aug. 8, 1977

[51] Int. Cl.² ............................................. G11C 11/40
[52] U.S. Cl. .................................... 365/105; 307/238; 365/115; 365/118; 365/128
[58] Field of Search ............... 365/105, 115, 118, 128; 307/238, 317 R

[56] References Cited

U.S. PATENT DOCUMENTS

| 3,763 | 10/1973 | 10001973 | Wilson et al./365 |
| 3,698,078 | 10/1972 | Redington | 365/115 |

*Primary Examiner*—Terrell W. Fears
*Attorney, Agent, or Firm*—Geoffrey H. Krauss; Joseph T. Cohen; Marvin Snyder

[57] ABSTRACT

One of a multiplicity of data values is permanently recorded at each data site in a two-dimensional data site array defined upon the surface of a semiconductor diode target by implanting an auxiliary bit thereat having an associated one of a multiplicity of possible dopant concentrations, at a uniform implantation depth, or of different implantation depths, at a uniform doping concentration, into a fabricated layer of the diode, responsive to respectively controlling the fluence or the landing energy of a writing ion beam.

18 Claims, 5 Drawing Figures

METHODS OF GRAY SCALE RECORDING AND ARCHIVAL MEMORY TARGET PRODUCED THEREBY

The invention herein described was made in the course of or under a contract or subcontract thereunder, with the Department of the Air Force.

BACKGROUND OF THE INVENTION

The present invention relates to permanent gray scale recording methods and more particularly to methods for permanently recording gray scale information in an archival memory target and to the target media produced thereby.

Modern data storage applications typically require storage of large quantities of non-erasable data. Generally, this data is stored in the digital binary format. Archival, or read-only, memory devices capable of storing large amounts of binary data, on the oder of $10^{15}$ bits per device, are compatible with modern data-processing apparatus, such as computers and the like. Storage of analog information, such as a frame of a video picture, may be accomplished by binary-digitization of the information content thereof, followed by suitable coding and storage of the coded information. However, storage in a two-valued binary memory, of a bit of information capable of assuming any one of a multiplicity of values requires that several, generally sequential, binary bits be utilized to store each binary-encoded word corresponding to one bit of multi-valued information. Thus, the amount of information storage is directly reduced by the number of binary bits required to form a single word for each multi-valued bit. It it desirable to digitize each element of an analog signal to one level of a multi-level signal, whereby each of a preselected number of "gray" levels can be threshold sensed and encoded with the single resulting gray scale bit being recorded at a single data storage location, whereby high rates of data writing (input) and reading (output) of the information stored in the system can be provided.

BRIEF SUMMARY OF THE INVENTION

In accordance with the invention, a planar diode target is formed of a first polarity-type semiconductor substrate supporting a remaining polarity-type layer fabricated thereon; a beam of ions is directed upon a surface of the planar diode target to implant an auxiliary region at selected areas of a two-dimensional array of potential data storage sites defined on the fabricated layer. A physical characteristic of each implanted region is varied to one of a multiplicity of values, in accordance with the associated value of gray scale information to be stored in that auxiliary region, whereby the current flowing through a depletion region of the planar diode, when reverse biased, is caused to vary in accordance with the value of the selected physical parameter, when scanned by a focussed electron beam.

The auxiliary regions may be formed by implantation of dopant ions, forming an auxiliary diode region of the first polarity-type semiconductor residing in the remaining polarity-type layer; the landing energy of the dopant ion beam, utilized for writing information into each storage site, is either maintained at a constant value with the fluence of the beam being varied to achieve constant implantation depth auxiliary regions of varying dopant concentrations, or the fluence of the beam is maintaned at a constant value and the landing energy is varied to achieve auxiliary regions of substantially constant dopant concentration but with varying separation from the depletion region.

The auxiliary regions may be created by damaging the semiconductor lattice of the fabricated layer to varying degrees by adjusting the fluence of ions accelerated to impinge upon the target surface, at a constant landing energy, or the average damage depth may be varied by maintaining a constant fluence and varying the landing energy of the ions creating the damage.

The gray-scale reading mechanism is similar for each of the various writing methods; a focussed beam of electrons is caused to impinge sequentially upon each data site, whereby local recombination within the auxiliary region is proportional to the depth or concentration of impurities or damage therein and establishes the number of minority carriers available for diffusion to the depletion region of the reverse-biased planar diode to vary the current flow through the depletion region and to an external load impedance.

Accordingly, it is an object of the present invention to provide a novel method for writing gray scale data into an archival memory target.

It is another object of the present invention to provide a novel target media for an archival memory, having gray scale information written therein by a selected one of a plurality of methods.

These and other objects of the present invention will become apparent upon a consideration of the following detailed description and the associated drawings.

DETAILED DESCRIPTION OF THE INVENTION

Figure 1A:
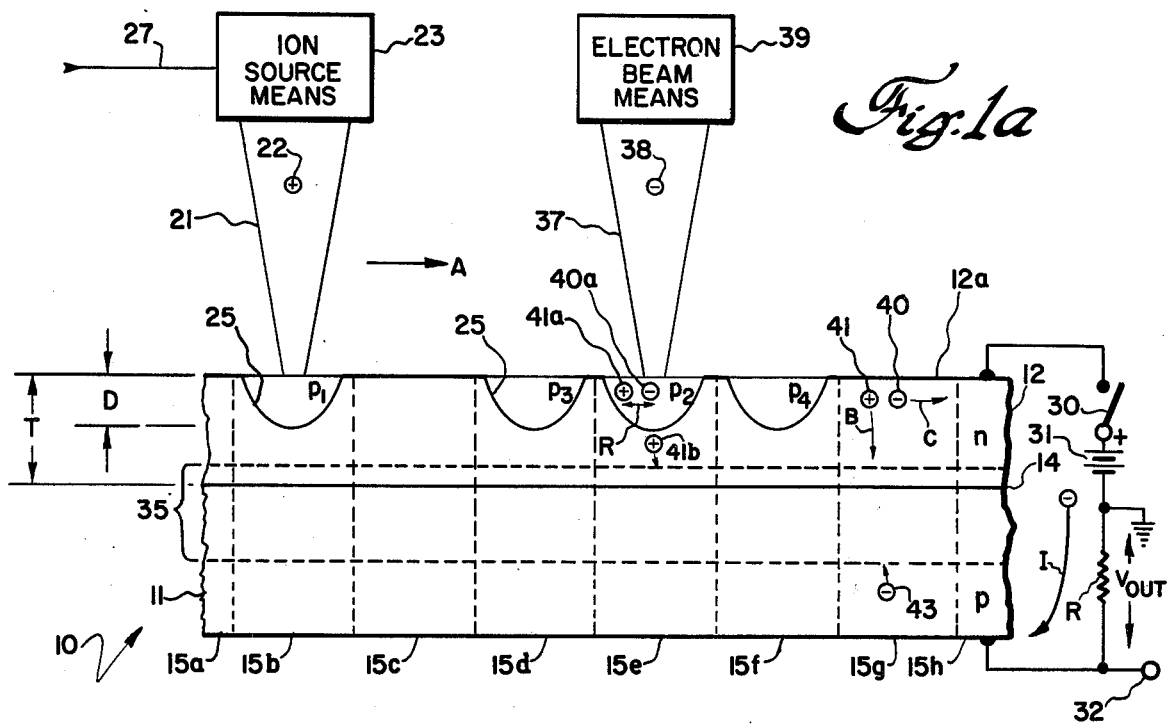
FIG. 1a is a sectional view of a portion of an archival memory target storing gray scale information by control of ion beam fluence during writing, and illustrating the data reading mechanism therefor.
Figure 1B:
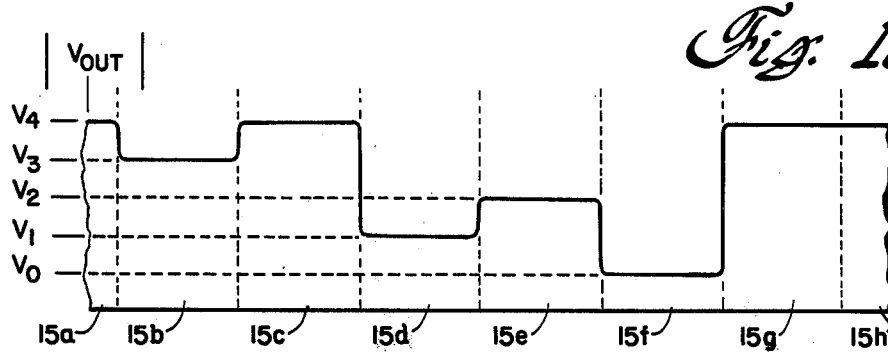
FIG. 1b is a graph illustrating the magnitude of the output voltage obtainable from a gray scale archival memory device in accordance with the principles of the present invention.

Referring initially to FIGS. 1a and 1b, an archival memory target 10, in which gray scale information is to be recorded, comprises a planar diode formed of a substrate 11 of a first polarity-type semiconductor, such as p-type silicon. A layer 12 of the same semiconductor material but of the opposite polarity-type, such as n-type silicon, is fabricated upon one major surface of substrate 11, to form a junction 14 therebetween. The planar target diode may be considered to have a two-dimensional array of possible data storage sites, which array is defined upon the free surface 12a of the fabricated layer, with each potential storage site defining a potential storage volume through the thickness of the target. A portion of a single row of potential data sites 15a–15h are illustrated in FIG. 1a, it being understood that the row of data sites continues generally to either side of the portion illustrated and that a multiplicity of the storage site rows are positioned parallel each to the other, into and out of the plane of the drawing, as required by the extent of the two-dimensional array thereof.

In a first presently preferred embodiment, a focussed beam 21 of ions 22, emanating from an ion source means 23, is scanned sequentially substantially to the center of each successive data storage site 15 and the ions of the beam are accelerated to a suitable high, but substantially constant, magnitude of energy to facilitate implantation in semiconductor layer 12 to a depth D less than the thickness T of the layer. Ions 22 are of a suitable element and polarity to implant a region 25 of the selected semiconductor and having the same polarity-type, e.g. p-type silicon, as the substrate 11. Thus, the positive charged ions of boron may be advantageously utilized, amongst other elements imparting a p-type region to a silicon semiconductor, for forming each of auxiliary regions 25. Ion source means 23 receives a multivalued gray scale signal, on line 27, to cause, in known manner, the fluence of the focussed beam to be varied during impingement upon a particular data storage site 15. The modulation of beam 21 causes lesser or greater numbers of dopant ions to be implanted within each auxiliary region 25 to essentially permanently write the associated one of the multiplicity of gray scale data values thereat.

In the writing process, assuming a gray scale signal having five possible values (e.g. a quinary digital signal), an illustrative data sequence 43412044 is written by the following procedure: focussed ion beam 21 is initially positioned, by movement of either the target 10 or ion source means 23, to cause focussed beam 21 to impinge substantially normal to the center of a first storage site 15a. The beam is modulated, in accordance with the value of the signal received at input 27, e.g. to substantially the "off" condition responsive to the first data value of 4, whereby substantially zero dopant ions impinge upon target top surface 12a. Thus, layer 12, in the region defining data site 15a, is substantially devoid of an auxiliary region 25. Beam 21 is sequentially scanned, in the direction of arrow A, to impinge substantially normal to top surface 12a at each successive data site 15b–15h. The fluence of the beam is modulated to a first value, response to the next data value (3), to implant a first concentration $P_1$ of dopant ions in the auxiliary region 25 associated with data site 15b. The beam is thence moved to impinge upon data site 15c, where the beam, having been modulated again to the "off" condition responsive to receipt of another data (4) value, implants substantially zero dopant ions, whereby an auxiliary region is not formed at this data site. Upon being scanned to data site 15d, the beam is modulated to a third value of fluence (data value 1) to implant an auxiliary region 25 having another concentration P3 of p-type dopants. Similarly, when ion beam is sequentially scanned to data regions 15e and 15f the beam is sequentially modulated to a fluence greater than the fluence utilized for implanting the auxiliary region at data site 15b but less than the fluence utilized for implanting the auxiliary region at data site 15d, whereby auxiliary region at site 15e has a concentration $p_2$; and an even further increased fluence, at data site 15f, to implant an auxiliary region thereat having a dopant concentration $p_4$ even greater than the concentration $p_3$ at data site 15d. Thus, the dopant concentrations of the implanted auxiliary region 25 are adjusted to meet the conditions that $$p_4 > p_3 > p_2 > p_1 > 0$$

for storing five different values of information in the memory target.

The multi-value gray scale data stored in target 10 is read by connecting, via switch means 30, a source of potential 31 in series electrical connection with a load resistance R, between layer 12 and substrate 11, in such manner as to reverse bias the junction 14 between the layer and substrate and create a depletion region 35 thereabout. The dopant concentrations in the layer and substrate are such that depletion region 35 extends a relatively larger distance into substrate layer 11 than into layer 12 with respect to junction 14; the depletion region distance into layer 12 is selected to prevent depletion region 35 from contacting any one of the auxiliary regions 25, whereby punch-through is avoided; thus, depletion region 35 extends into layer 12 a distance substantially less than the distance (T-D). An output voltage $V_{out}$ is generated across load resistor R and is available at output terminal 32, with respect to the junction between the source and the resistor. It should be understood that the "read" bias circuit comprised of source 31 and load resistance R is only required in the reading mode and writing of the implanted auxiliary regions 25, as hereinabove described, does not require either biasing of junction 14 or formation of depletion region 35, although the presence of the reading circuitry allows reading of the value being implanted during the writing stage, and may be used for writing-error control purposes.

A focussed beam 37 of electrons 38 is provided by an electron beam means 39 for sequential scanning, in the direction of arrow A. The beam electrons 38 are accelerated to a substantially constant energy, typically on the order of 2 keV., and penetrate into layer 12 (and the auxiliary regions 25 if present within layer 12 at a particular data site) to generate pairs of electrons 40 and holes 41 therein. At a storage site, such as sites 15a, 15c, 15g and 15h, devoid of auxiliary region 25, the electrons 40 and holes 41 generated by the beam do not undergo substantial recombination within layer 12; holes 41 diffuse, in the direction of arrow B toward depletion region 35 for recombination with other electrons 43 supplied from the negative terminal of potential source 31; beam-generated electrons 40 flow, in the direction of arrow C, from layer 12 to the positive terminal of potential source means 31. Thus, an electron flow I, of relatively high magnitude, flows from source means 31 through load resistor R and the target and returns to the positive terminal of the source. A relatively large voltage drop appears across the load resistor and hence at the output voltage terminal 32. Thus, the magnitude of the output voltage $|V_{out}|$ assumes its largest value $V_4$ (FIG. 1b) responsive to the electron beam impinging upon the target top surface of regions 15a, 15c, 15g and 15h devoid of an auxiliary implanted region 25.

Impingement of beam 37 upon a data storage site having an implanted auxiliary region 25, such as storage site 15e having a region implanted with a dopant concentration $p_2$, causes generation of electron-hole pairs in a manner analogous to the electron-hole pairs generated in a site devoid of an implanted region. However, a relatively large fraction of the generated electrons 40a and generated hole 41a tend to recombine locally, i.e. within the auxiliary region, to an extent substantially proportional to the dopant concentration $p_n$ of the particular auxiliary region. Those holes 41b which do not undergo recombination within a particular auxiliary region diffuse toward depletion region 35 for recombination with electrons 43 (excess free carriers) in the p-type substrate and cause some current to flow through load resistor R and generate an output voltage signal. As the magnitude of diffusion holes 41b is inversely proportional to the dopant concentration in an auxiliary region, which dopant concentration varies between several discrete, and preferably substantially equally spaced, values, the magnitude of the current supplied from the source, and hence the magnitude of the output voltage, will assume one of a like number of levels, having similar relative differences in accordance with the auxiliary region doping levels. Thus, when beam 37 impinges on data storage site 15e having an auxiliary region of dopant concentration $p_2$, the associated output voltage has a magnitude $V_2$ less than the output voltage magnitude $V_4$ of an un-implanted region, and also less than the output voltage magnitude $V_3$ of a data storage site, e.g. site 15b, having an auxiliary region of dopant concentration, e.g. $p_1$, less than the doping concentration $p_2$ of site 15e. Similarly, the output voltage derived from beam 37 impinging upon data sites having greater dopant concentrations, such as data sites 15d and 15f, respectively, having dopant concentrations $p_3$ and $p_4$, will be respectively of lesser magnitude, e.g. the output voltage has a magnitude $V_1$ less than output voltage magnitude $V_2$, for beam impingement upon data site 15b and has a magnitude $V_0$ (the least magnitude in the illustrative quinary system) for impingement upon a data site having the greatest dopant concentration $p_4$. Thus, as the beam sequentially scans, in the direction of arrow A, from data site 15a to data site 15h, the output voltage assumes the values associated with data bits of magnitude 4, 3, 4, 1, 2, 0, 4 and 4, to retrieve the initial quinary data sequence implanted in the archival target plane.

Further considerations as to resolution between adjacent sites 15 (and hence, data density) and the like may be found by reference to pending U.S. application Ser. No. 669,404, filed Mar. 22, 1976, now U.S. Pat. No. 4,064,495, issued Dec. 20, 1977 assigned to the assignee of the present invention, and incorporated herein by reference. This application discloses ion-implanted memory media and methods, for storage solely of binary data therein.

A second presently preferred method for storage of multi-value gray scale information in a target medium 10 replaces the dopant ion beam of FIG. 1a with a beam, at substantially constant energy, of ions of a non-dopant element, such as the inert elements. Impingement of a focussed beam of non-dopant ions upon fabricated layer 12 causes damage of the semiconductor lattice thereof. The basic considerations for ion-damage writing are disclosed in pending U.S. application Ser. No. 770,698, filed Feb. 22, 1977, now U.S. Pat. No. 4,099,261, issued July 4, 1978, assigned to the assignee of the present application and incorporated herein by reference; this application discloses implantation damage writing techniques suitable solely for writing binary data into a memory target. We have found that varying the fluence of the beam, while maintaining constant beam energy, causes proportionate changes in the number of carrier trapping defect sites formed within an auxiliary region, which carrier trapping defect sites effect the lifetime of the holes and electrons generated by the electron beam utilized for reading, in an approximately inverse manner, to modulate the output voltage in accordance with the amount of damage in a particular auxiliary region. Thus, the amount of damage is controlled in accordance with the modulation of the non-dopant ion beam responsive to a multi-value gray scale message to be recorded. Therefore, a structure and writing and reading methods similar to those discussed with reference to the dopant-ion-at constant-energy embodiment of FIG. 1a obtain, with the additional consideration that, while the overall degree of lattice disorder varies fairly linearly with fluence, a sufficiently high fluence will tend to saturate the lattice with damage and create an amorphous auxiliary region. We have found that this saturation fluence varies for different mass ions, but is generally of a magnitude allowing a relatively large range of fluence variations, and hence of output voltage, to be obtained even for relatively heavy ions used in the data writing process.

Figure 2:
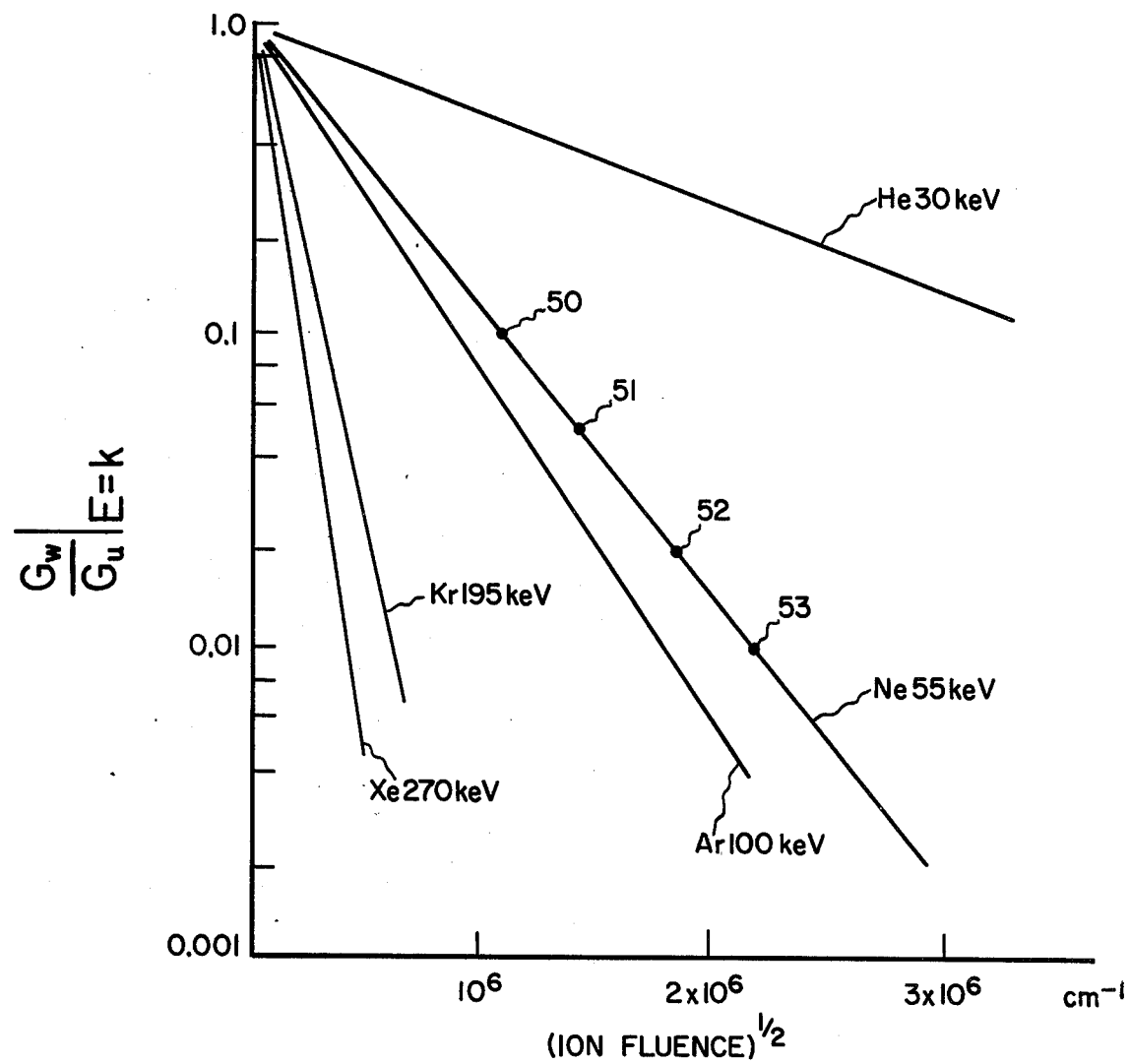
FIG. 2 is a graph illustrating the relationship between target gain and ion fluence for data storage by inert ion damage techniques.

Referring now to FIG. 2, the ratio of written gain $G_w$ to unwritten gain $G_u$, i.e. the ratio of planar diode current I (FIG. 1a) for a written area containing an auxiliary region 25 in which the lattice of layer 12 is damaged, to the planar diode current in an unwritten area devoid of an auxiliary damage region 25, is illustrated at constant reading beam energy ($E=k$) for various values of the one-half power of the ion fluence in per centimeter units, for five different species of inert ions, indicated with their associated constant writing beam energies. It should be understood that ion species other than those illustrated may be used to equal advantage.

By way of illustration, a frame of a video signal may be stored, utilizing writing with neon ions at a beam energy of about 55keV., by modulating the beam 21 essentially to its "off" condition to achieve a gain ratio of 1.0 for the synchronization interval at the start of the frame, and by modulating the beam between half-power ion fluence levels of about $10^6$/cm. and $2.1 \times 10^6$/cm. to achieve lesser gain varying between about 0.1 and about 0.01 times, relative to the undamaged auxiliary area gains, for implantation of regions having a discrete number of gray scale steps. Thus, a first output value, at gain 0.1 times that of an unwritten area, may be realized at graph point 50 with an ion fluence of about $10^{12}$ ions per square centimeter; a relative gain of about 0.05 with a fluence of about $2.3 \times 10^{12}$ ions per square centimeter, at point 51; a relative gain of about 0.02 (point 52) at a fluence of about $3.2 \times 10^{12}$ ions per square centimeter and a relative gain of about 0.01 (point 53) with a fluence of about $4.4 \times 10^{12}$ ions per square centimeter, utilizing neon for implantation of damaged auxiliary regions in silicon. Known signal processing techniques may be utilized to modify the signal at input 27 to the ion source means, or the voltage output signal at output terminal 32 (FIG. 1a), to achieve a linear relationship between a gray scale input voltage sequence and the corresponding target output voltage sequence of gray scale values.

Figure 1C:
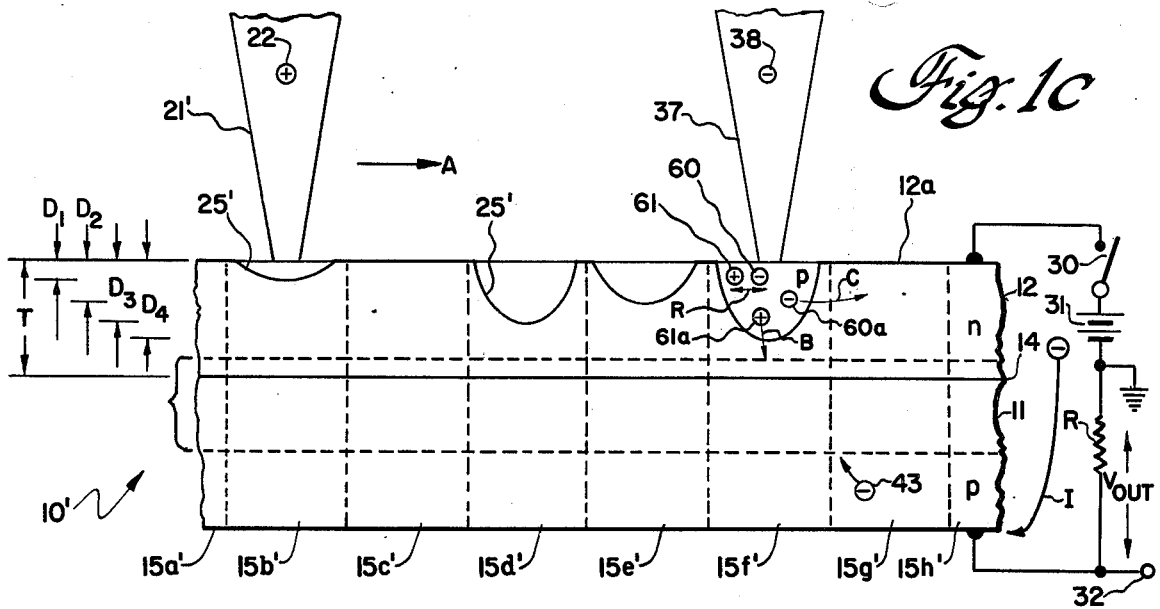
FIG. 1c is a sectional view of a portion of an archival memory target written by landing energy modulation techniques and illustrating the manner of reading information therefrom.

Referring now to FIGS. 1b and 1c, wherein like reference designations are utilized for like elements, a third presently preferred method for storing gray-scale data in an archival memory target utilizes a beam of ions having a substantially constant fluence, but having a variable landing energy. All of the auxiliary regions 25' in layer 12 of target 10' are implanted with the same doping ion fluence. The depth $D_n$ to which each of the implanted doped regions extend below top layer surface 12a varies in accordance with the landing energy of the ion beam 21'. Thus, the beam is modulated substantially to an "off" condition, when impingent upon data sites, e.g. 14a', 15c', 15g' and 15h' at which a first gray-scale data value is to be stored, whereby the ions of the beam have insufficient average energy to form an auxiliary region. When the landing energy $E_L$ (and fluence) of ion beam 21' is sufficient to implant dopant ions in quantity sufficient to change the polarity-type of the semiconductor and create an auxiliary region, each auxiliary region is implanted to a lesser or greater depth dependent upon the lesser or greater magnitude of the landing energy. Thus, beam 21' impingent upon data site 15b' has a first landing energy value $E_{L1}$ sufficient to implant the auxiliary region 25' thereat to an effective depth $D_1$; as the beam moves in the direction of arrow A, the beam impinges upon a data site in which the next sequential gray-scale data value is to be implanted, e.g. data site 15e', and the beam is modulated to a relatively greater landing energy $E_{L2}$ to implant an auxiliary region having a somewhat greater depth $D_2$. Similarly, a next successively larger value of gray-scale information is stored, e.g. at data site 15d', by raising the beam landing energy to an even greater value $E_{L3}$, to implant a doped region having a greater depth $D_3$. The beam energy is raised to a greatest value $E_{L4}$ (in a quinary data system), as at data site 15f', to implant a region thereat having a greatest depth $D_4$ below layer top surface 12a. Thus, the gray scale values are implemented by formation of auxiliary regions of increasing depth $$0 < D_1 < D_2 < D_3 < D_4$$

responsive to modulating the landing energy level of the beam between discrete landing energy magnitudes associated with each region depth, such that $$E_{L_{off}} < E_{L_1} < E_{L_2} < E_{L_3} < E_{L_4}$$

where the highest landing energy (e.g. $E_{L4}$) is insufficient to implant a region having a depth equal to the distance between layer top surface 12a and the closest surface of depletion region 35, to avoid punch-through.

In another presently preferred embodiment, each of auxiliary regions 25' is caused by lattice damage induced by non-dopant ions impingent upon layer top surface 12a, rather than by means of dopant ions. The beam fluence is again maintained substantially constant and the beam landing energy is modulated to produce damaged auxiliary regions having varying depths in accordance with the modulating waveform.

In both methods of auxiliary region depth modulation (whether by implantation dopant ions or by inert ion lattice damage techniques) a similar reading technique is used. The beam 37 of electrons 38 is maintained at a substantially constant landing energy during impingement of the beam upon the target; the beam produces pairs of electrons 60 and holes 61 within the semiconductor material below its point of impingement. When the beam is impingent upon an auxiliary region, such as at a data site 15f', only a small portion of the holes 61a diffuse, in the direction of arrow B, to the depletion region 35 for recombination with electrons 43 supplied from the negative terminal of reverse-bias source 31. The remainder of the holes 61 combine, as indicated by arrow R, with the beam-generated electrons 60 within the auxiliary region. The greater the depth of the implanted region, the greater is the electron-hole recombination within that region, whereby correspondingly fewer holes 61a diffuse to the depletion region. Thus, when beam 37 has impinged upon data site 15f', having the deepest $D_4$ auxiliary region, relatively little current I is drawn from source 31 and the output voltage $V_{out}$, at output terminal 32, is relatively low (having the value $V_0$, as at region 15f of FIG. 1b). When beam 37 impinges upon data site 15d', having an auxiliary region of depth $D_3$ less than the maximum depth, a somewhat greater number of holes diffuses the depletion region to cause a correspondingly greater magnitude of output voltage (corresponding e.g. to $V_1$, at site 15d, in FIG. 1b). Impingement of the electron beam at site 15e' and 15b', respectively, cause increasingly greater currents and output voltages to appear at discrete levels in accordance with the lesser implantation depths $D_2$ and $D_1$, respectively of the auxiliary regions at these data sites (corresponding to output voltage levels $V_2$ and $V_3$, respectively, in FIG. 1b). Finally, impingement of the electron beam upon a data site, e.g. data sites 15a', 15c', 15g' or 15h', devoid of an implanted auxiliary region provides minimum recombination of the beam-generated electrons and holes and facilitates the greatest flow of recombination current I and the greatest magnitude of output voltage from the target (corresponding to maximum output voltage magnitude $D_4$ in FIG. 1b). Thus, gray-scale data values are permanently storable in a semiconductor planar diode structure by implanting auxiliary regions at each a plurality of data sites, with each auxiliary region having a depth below the diode top surface corresponding to an associated one of the plurality of gray-scale values.

Figure 3:
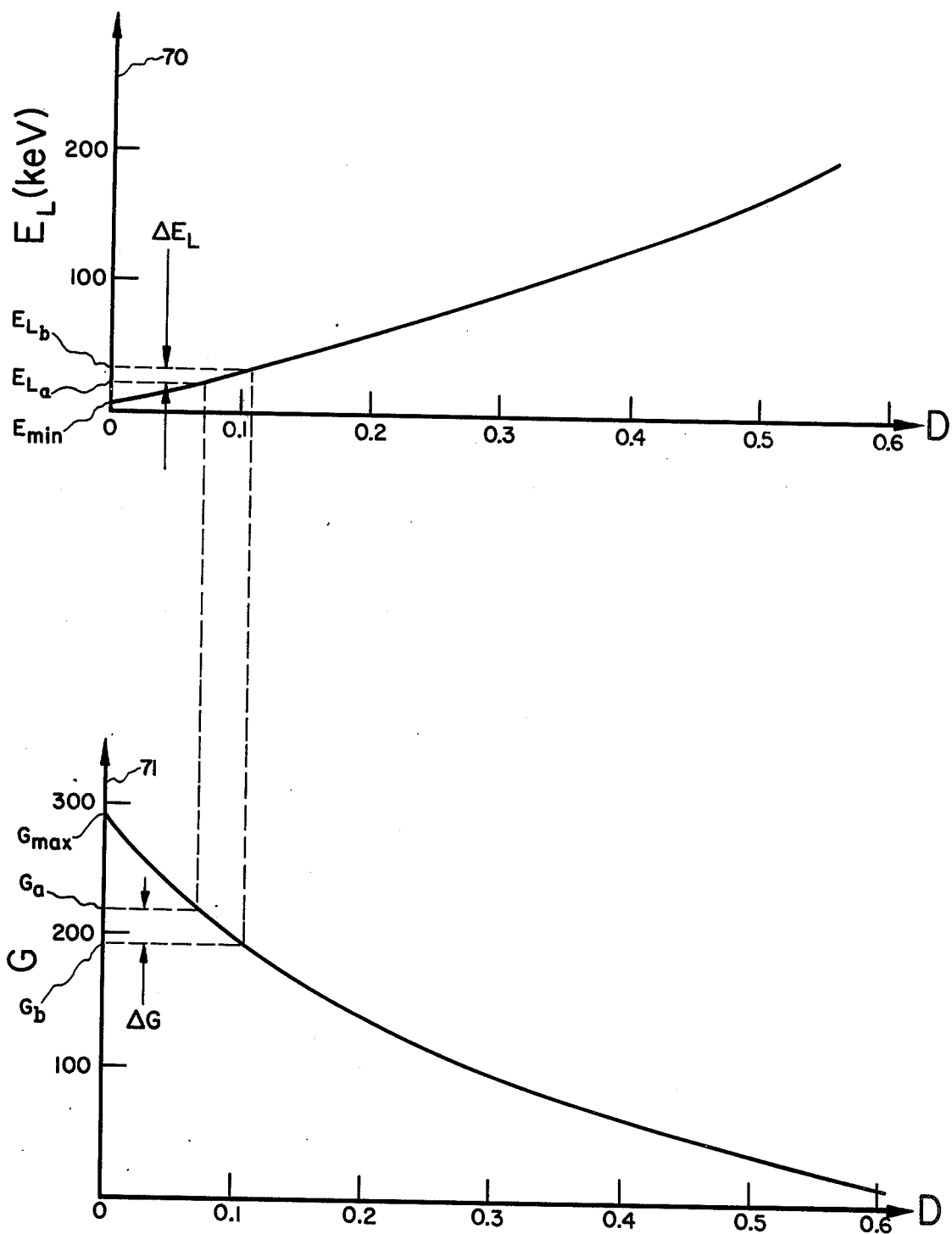
FIG. 3 is a pair of inter-related graphs illustrating the relationship between target gain, auxiliary region depth and landing energy of the writing beam for the depth modulation data storage technique.

Referring now to FIG. 3, graphs illustrate the performance of a target 10' implanted with auxiliary regions of differing depth. Target 10' has a p-type silicon substrate and an n-type silicon layer with p-type auxiliary regions being implanted by means of a beam 21' of boron ions. The abscissae of the coordinated graphs indicate implantation depth D, in micrometers, while ordinate 70 is scaled in increasing values of landing energy $E_L$ of the writing beam and ordinate 71 is scaled in increasing values of gain G, for a diode layer thickness T of about 2.8 micrometers, with a reading electron beam 37 energy of about 10keV. It will be seen that a first value of landing energy $E_{L_a}$ implants an auxiliary region of depth somewhat less than 0.1 micrometer and, when the electron reading beam is impingent upon that region, yields an associate gain $G_a$ somewhat in excess of 200; a somewhat greater value of landing energy $E_{L_b}$ implants an auxiliary region to a somewhat greater depth, in excess of 0.1 micrometer, and upon reading yields a somewhat lower gain $G_b$ less than 200. Modulation of the landing energy of the ion beam in increasing manner between the lower and upper landing energies $E_{L_a}$ and $E_{L_b}$, respectively, to various discrete values within the range $\Delta E_L$ yields a range of gains $\Delta G$, between upper and lower gains $G_a$ and $G_b$, respectively, in decreasing manner. For some minimum landing energy $E_{min}$ the auxiliary regions are implanted to essentially a zero depth and yield a maximum target gain $G_{max}$.

It should be understood that implantation of dopant ions will generally require a post annealing of the target to reduce lattice damage caused by implantation of the dopant ions at typical landing energies. Lack of a post-annealing step will generally allow each auxiliary region to function as if damage is the primary effect, rather than as if dopants of the polarity-type of the substrate were present thereat.

While the present invention has been described with reference to several preferred embodiments thereof, many variations and modifications, including writing a data value by simultaneous variation of both fluence and landing energy, will now become apparent to those skilled in the art. It is our intent, therefore, to be limited solely by the appending claims and not by the specific embodiments described herein.

What is claimed is:

1. A method for substantially permanently storing multivalued gray scale information, comprising the steps of:
    (a) providing a planar diode target comprised of a first polarity-type semiconductor substrate supporting a continuous remaining polarity-type layer fabricated directly thereon;
    (b) focusing a beam of ions upon the major surface of the fabricated layer farthest from said substrate;
    (c) implanting ions into said layer to form an auxiliary semiconductor region at selected sites of a two-dimensional array of possible data storage sites defined on the major surface of the fabricated layer furthest from said substrate; and
    (d) varying a physical characteristic of each implanted region to one of a multiplicity of values in accordance with the associated value of gray scale information to be stored in substantially non-erasable manner in that auxiliary region.

2. A method as set forth in claim 1, wherein step (c) includes the step of selecting the ions of said beam to be dopant ions imparting the first polarity-type to each auxiliary semiconductor region.

3. A method as set forth in claim 2, wherein step (d) comprises the steps of: maintaining the landing energy of the dopant ion beam at a substantially constant value; and varying the fluence of the beam to implant each auxiliary region with a substantially constant implantation depth and with one of a multiplicity of dopant concentrations each of said multiplicity of concentrations corresponding to an associated gray scale information value to be stored at an auxiliary region.

4. A method as set forth in claim 2, wherein step (c) comprises the steps of: maintaining the fluence of the dopant ion beam at a substantially constant value; and varying the landing energy of the beam to implant each auxiliary region with a substantially constant dopant concentration and with one of a multiplicity of depths into said fabricated layer, each of said multiplicity of depths corresponding to an associated value of gray scale information to be stored at an auxiliary region.

5. A method as set forth in claim 2, further comprising the step of annealing the target after dopant region implantation.

6. A method as set forth in claim 1, wherein step (c) includes the steps of: selecting the ions of said beam to be non-dopant ions; and damaging the semiconductor lattice of the fabricated layer by means of the beam of non-dopant ions to create each auxiliary region.

7. A method as set forth in claim 6, wherein step (d) comprises the steps of: maintaining the landing energy of the inert ions at a substantially constant value; and varying the fluence of the ions of the beam to create one of a multiplicity of amounts of damage at each potential data site in accordance with the value of an associated one of the multiplicity of gray scale data values to be stored thereat.

8. A method as set forth in claim 6, wherein step (d) comprises the steps of: maintaining the beam of inert ions at a constant fluence; and varying the landing energy of the ions creating the damage in accordance with the value of gray scale information to be stored thereat to vary the average damage depth into the fabricated layer to one of an associated multiplicity of depths.

9. A method as set forth in claim 1, further comprising the steps of:
    reverse biasing the junction between said layer and said substrate;
    scanning a focused beam of electrons to impinge sequentially upon each data site; and
    monitoring the current flow through said reverse-biased junction to derive an output from said target.

10. An archival memory target for substantially permanently gray scale information, comprising:
    a substrate of a semiconductor material of a first polarity-type;
    a continuous layer of said semiconductor material and of a remaining polarity-type, said layer being fabricated directly upon a major surface of said substrate to form a junction therebetween and having a top surface opposite said junction, said semiconductor layer having a two-dimensional array of possible data sites defined upon said top surface; and
    an auxiliary semiconductor region formed into said fabricated layer below said top surface at at least some of said possible data sites;
    a physical characteristic of each said auxiliary region being varied to one of a multiplicity of values to store in substantially non-erasable manner a corresponding one of a multiplicity of gray scale data values at each possible data site.

11. An archival memory target as set forth in claim 10, wherein said physical characteristic being varied is the dopant concentration.

12. An archival memory target as set forth in claim 11, wherein each auxiliary region is a doped semiconductor region of said first polarity-type.

13. An archival memory target as set forth in claim 12, wherein each said region has a substantially constant depth below said fabricated layer top surface.

14. An archival memory target as set forth in claim 10, wherein said physical characteristic being varied is the depth of each of said auxiliary regions below said fabricated layer top surface.

15. An archival memory target as set forth in claim 14, wherein each said auxiliary region is a doped semiconductor region of said first polarity-type.

16. An archival memory target as set forth in claim 15, wherein all of said auxiliary regions have substantially equal dopant concentrations.

17. An archival memory target as set forth in claim 14, wherein each of said auxiliary regions is a region of damage to the lattice of the semiconductor material of said fabricated layer.

18. An archival memory target as set forth in claim 10, wherein said physical characteristic being varied is the amount of damage to the lattice of the semiconductor material of said fabricated layer, said auxiliary regions having a substantially constant depth below said fabricated layer top surface.

* * * * *